(12) United States Patent
Shin

(10) Patent No.: US 7,636,266 B2
(45) Date of Patent: Dec. 22, 2009

(54) SEMICONDUCTOR MEMORY APPARATUS CAPABLE OF WRITING DATA AT HIGH SPEED

(75) Inventor: Sun Hye Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 143 days.

(21) Appl. No.: 11/647,129

(22) Filed: Dec. 29, 2006

(65) Prior Publication Data
US 2008/0002510 A1    Jan. 3, 2008

(30) Foreign Application Priority Data
Jun. 29, 2006    (KR) .................... 10-2006-0059635

(51) Int. Cl.
*G11C 7/22*  (2006.01)

(52) U.S. Cl. .............. 365/189.16; 365/189.05; 365/194; 365/210.12; 365/199

(58) Field of Classification Search ............ 365/189.05, 365/189.116, 194, 210.12, 199
See application file for complete search history.

(56) References Cited

U.S. PATENT DOCUMENTS

| 5,267,197 | A | 11/1993 | McClure |
| 5,936,896 | A | 8/1999 | Cho et al. |
| 6,052,328 | A * | 4/2000 | Ternullo et al. ........ 365/233.16 |
| 6,212,114 | B1 * | 4/2001 | Cowles ........................ 365/201 |
| 6,940,767 | B2 | 9/2005 | Ooishi et al. |
| 6,965,539 | B2 | 11/2005 | Lee |
| 7,042,799 | B2 | 5/2006 | Cho |
| 2002/0030509 | A1 * | 3/2002 | Sakata et al. .................. 326/83 |
| 2005/0117434 | A1 | 6/2005 | Song |
| 2005/0169087 | A1 * | 8/2005 | Kono et al. ................. 365/226 |
| 2005/0254159 | A1 * | 11/2005 | Venca et al. .................. 360/68 |
| 2007/0253242 | A1 * | 11/2007 | Parkinson et al. ........... 365/163 |

FOREIGN PATENT DOCUMENTS

| JP | 08-235869 | 9/1995 |
| JP | 10-125072 A | 5/1998 |
| JP | 2003-85997 A | 3/2003 |
| KR | 10 1998 0014000 | 5/1998 |
| KR | 1020030032178 | 4/2003 |
| KR | 1020040102725 | 12/2004 |
| KR | 1020060038759 | 5/2006 |

* cited by examiner

*Primary Examiner*—Thong Q Le
(74) *Attorney, Agent, or Firm*—Venable LLP; Jeffri A. Kaminski

(57) ABSTRACT

A semiconductor memory apparatus includes a write driver that receives a reset signal, a write enable signal, and a data signal, and transmits data, which is input from the data signal, to an input/output (IO) line when the write enable signal is applied, and an overdrive unit that is connected to the IO line of the write driver and outputs a voltage larger than a driving voltage of the write driver when the write driver outputs a high level.

14 Claims, 2 Drawing Sheets

SEMICONDUCTOR MEMORY APPARATUS CAPABLE OF WRITING DATA AT HIGH SPEED

BACKGROUND OF THE INVENTION

1. Technical Field

The present invention relates to a semiconductor memory apparatus, and more particularly, to a write driver of the semiconductor memory apparatus.

2. Related Art

A conventional write driver writes data stored in cells through an input/output (IO) line when executing a write command after an active command.

More specifically, a semiconductor memory apparatus includes bit lines and bit line bars that transmit the data stored in the cells, and the IO lines that are connected to the bit lines and the bit line bars and transmit the data. The IO lines are arranged in pairs, that is, IO and IO/. The write driver serves to transmit the data of the bit lines into the IO lines. The write driver amplifies the data, which is input and transmitted through an input pin DQ of a semiconductor memory apparatus, and outputs the amplified data to the IO lines.

Recently, as a semiconductor memory apparatus needs to operate at high speed, it is most necessary to reduce the amount of time required for a write operation. However, reducing the amount of time required for the write operation often requires a change in the structure of the write driver, which may require additional design and costs.

SUMMARY OF THE INVENTION

Embodiments of the present invention provide a semiconductor memory apparatus that is capable of performing a stable write operation at high speed without a need to change the structure of the write driver.

An embodiment of the present invention provides a semiconductor memory apparatus that includes a write driver that transmits input data to an input/output (IO) line during a write operation, and an overdrive unit that drives the IO line at a predetermined voltage.

Another embodiment of the present invention provides a semiconductor memory apparatus that includes a write driver that receives a reset signal, a write enable signal, and a data signal, and transmits data, which is input from the data signal, to an input/output (IO) line when the write enable signal is applied, and an overdrive unit that is connected to the IO line of the write driver and outputs a voltage larger than a driving voltage of the write driver when the write driver outputs a high level.

Still another embodiment of the present invention provides a semiconductor memory apparatus that includes a write driver that receives a reset signal, a write enable signal, and a data signal, and transmits data received from the data signal to an input/output (IO) line when the write enable signal is applied; and an overdrive unit that is connected to the IO line of the write driver and operates such that a first voltage level, which is higher than a level of a driving voltage of the write driver, is output when the reset signal is at a logic high level and an output signal of the write driver is a logic high level, and a second voltage level, which is lower than the first voltage level, is output when the reset signal is at a logic low level.

DESCRIPTION OF EXEMPLARY EMBODIMENT

Embodiments of the present invention will now be described in detail with reference to the accompanying drawings.

Figure 1:
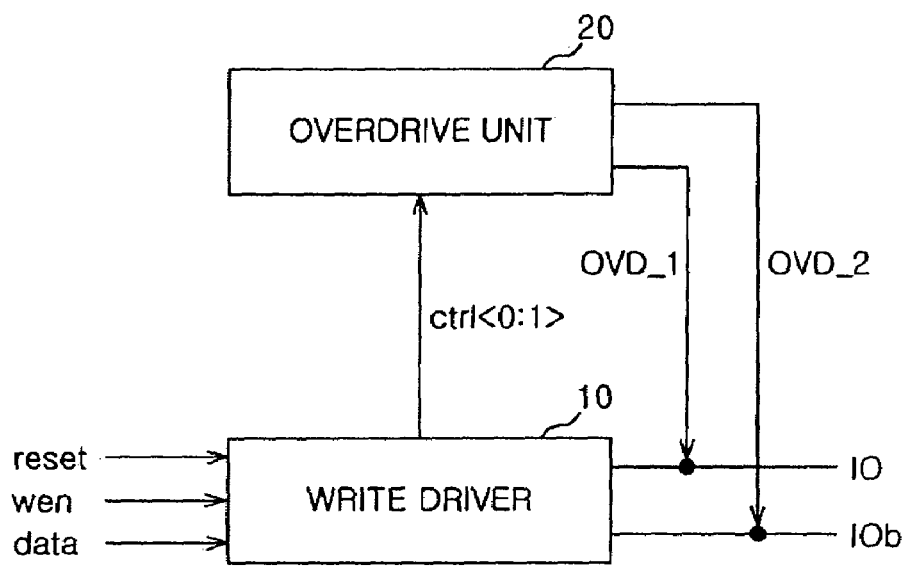
FIG. 1 is a block diagram of a semiconductor memory apparatus according to an embodiment of the invention.

Referring to FIG. 1, a semiconductor memory apparatus according to an embodiment of the invention may include a write driver 10 and an overdrive unit 20. The write driver 10 may receive a reset signal reset, a write enable signal wen, and data, and outputs a first output signal IO, a second output signal IOb, and a control signal ctrl<0:1>.

Figure 2:
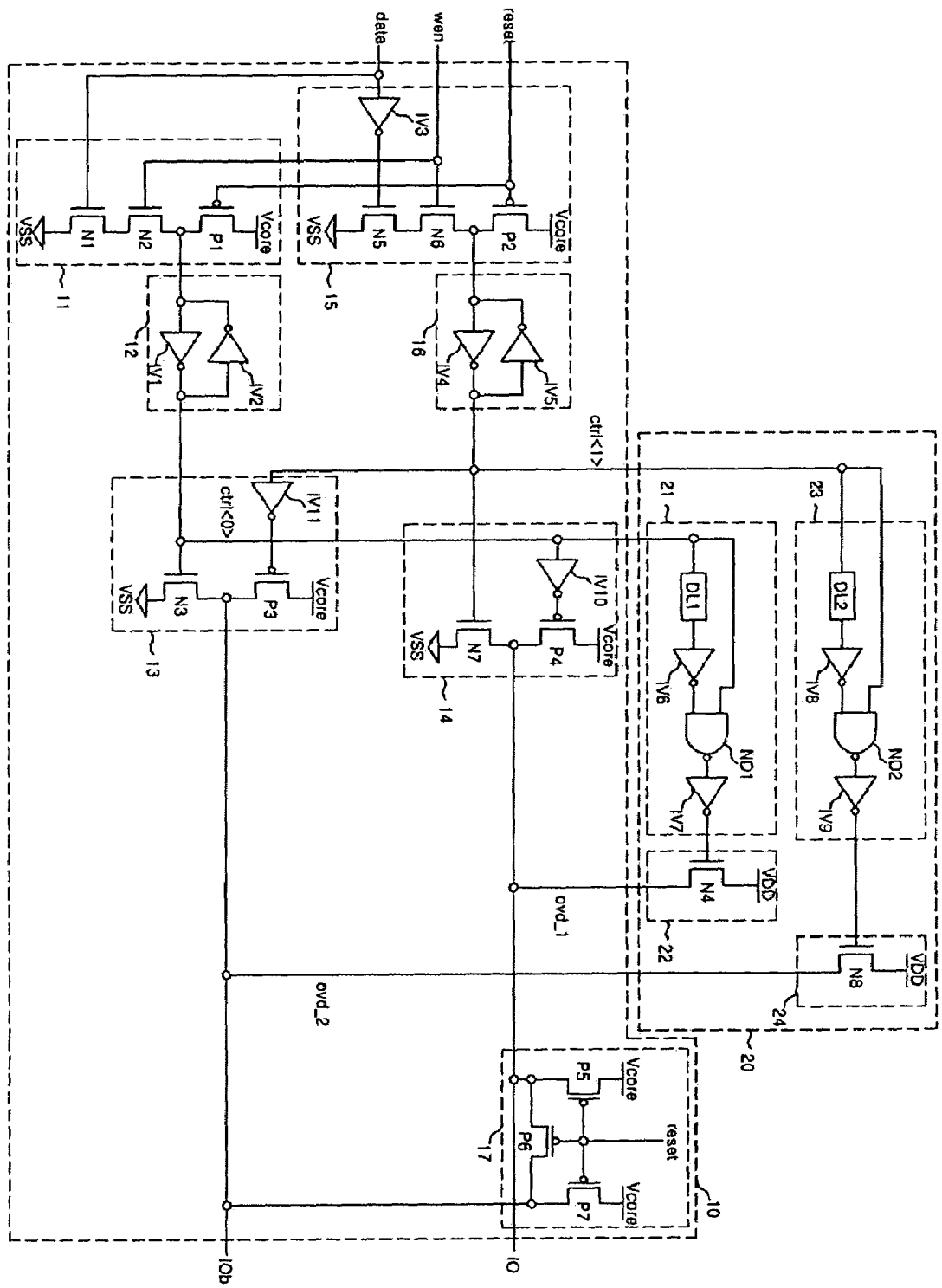
FIG. 2 is a circuit diagram of a semiconductor memory apparatus according to an embodiment of the invention.

As shown in FIG. 2, the write driver 10 according to an embodiment of the present invention includes a first input unit 11, a first latch unit 12, a first output unit 14, a second output unit 13, a second input unit 15, a second latch unit 16, and an initialization unit 17.

When the data is at a logic high level during a write operation, the first input unit 11 outputs a logic low signal, and when the reset signal is at a logic low level, the first input unit 11 outputs a logic high signal. The first input unit 11 includes a first transistor P1, and second and third transistors N2 and N1 that are connected in series between a core voltage terminal Vcore and a ground terminal Vss. The first transistor P1 responds to the reset signal reset, the second NMOS transistor N2 responds to the write enable signal wen, and the first NMOS transistor N1 responds to the data. The output of the first input unit 11 is the signal at a connection node between the first PMOS transistor P1 and the second NMOS transistor N2.

The first latch unit 12 includes a first inverter IV1 and a second inverter IV2 that are connected in a latch configuration. The first latch unit 12 maintains a level of the output signal of the first input unit 11 and outputs the inverse thereof.

When a data signal, which is inverted by a third inverter IV3, is at a logic high level during the write operation, the second input unit 15 outputs a logic low signal, and when the reset signal reset is at a logic low level, the second input unit 15 outputs a logic high signal. The second input unit 15 includes a fourth transistor P2, a fifth transistor N6, and a sixth transistor N5 that are connected in series between a core voltage terminal Vcore and a ground terminal Vss, as well as a third inverter IV3. The fourth transistor P2 has a gate terminal to which the reset signal reset is input, and a source terminal to which the core voltage Vcore is applied. The fifth transistor N6 includes a gate terminal to which the write enable signal wen is input, and a drain terminal that is connected to a drain terminal of the fourth transistor P2. The third inverter IV3 receives the data signal and supplies the inverted data signal to the sixth transistor N5. The sixth transistor N5 has a gate terminal to which the output signal of the third inverter IV3 is input, a drain terminal that is connected to a source terminal of the fifth transistor N6, and a source terminal that is connected to the ground terminal VSS. The output terminal of the second input unit 15 is a common node connecting the drain terminals of the fourth transistor P2 and the fifth transistor N6.

Like the first latch unit 12, the second latch unit 16 includes two inverters IV4 and IV5. The second latch unit 16 maintains a level of the output signal of the second input unit 15 and outputs the inverse thereof.

When the output signal of the first latch unit 12 is at a logic high, the first output unit 14 outputs a high signal at the level of the core voltage Vcore, and when the output signal of the second latch unit 16 is at a logic high level, the first output unit 14 outputs a logic low signal. The first output unit 14 includes a sixth inverter IV10, a seventh transistor P4, and an eighth transistor N7. The sixth inverter IV10 has an input terminal to which the output signal of the first latch unit 12 is input. The seventh transistor P4 has a gate terminal to which the output signal of the sixth inverter IV10 is input and a source terminal to which the core voltage Vcore is applied. The eighth transistor N7 has a gate terminal to which the output signal of the second latch unit 16 is input, a drain terminal that is connected to the drain terminal of the seventh transistor P4, and a source terminal that is connected to the ground terminal VSS. The output terminal of the first output unit 14 is a node at which a drain terminal of the seventh transistor P4 and the drain terminal of the eighth transistor N7 are connected to each other.

When the output signal of the second latch unit 16 is at a logic high level, the second output unit 13 outputs a high signal at the core voltage Vcore level, and when the output signal of the first latch unit 12 is at a logic high level, the second output unit 13 outputs a low signal. The second output unit 13 includes a seventh inverter IV11, a ninth transistor P3, and a tenth transistor N3. The seventh inverter IV11 has an input terminal to which the output signal of the second latch unit 16 is input. The ninth transistor P3 has a gate terminal to which an output signal of the seventh inverter IV11 is input and a source terminal to which the core voltage Vcore is applied. The tenth transistor N3 has a gate terminal to which the output signal of the first latch unit 12 is input, a drain terminal that is connected to a drain terminal of the ninth transistor P3, and a source terminal that is connected to a ground terminal VSS. The output terminal of the second output unit 13 is a node at which the drain terminal of the ninth transistor P3 and the drain terminal of the tenth transistor N3 are connected to each other.

The initialization unit 17 receives the reset signal reset and initializes the output signals of the first output unit 14 and the second output unit 13 to the same core voltage Vcore. At this time, the output signals of the first output unit 14 and second output unit 13 become the first output signal IO and the second output signal IOb of the write driver 10, respectively. The initialization unit 17 includes an eleventh transistor P5, a twelfth transistor P7, and a thirteenth transistor P6. The eleventh transistor P5 has a source terminal to which the core voltage Vcore is applied, a gate terminal to which the reset signal reset is input, and a drain terminal that is connected to the output terminal of the first output unit 14. The twelfth transistor P7 has a gate terminal to which the reset signal reset is input, a source terminal to which the core voltage Vcore is applied, and a drain terminal that is connected to the output terminal of the second output unit 13. The thirteenth transistor P6 has a gate terminal to which the reset signal reset is input, and a drain terminal and a source terminal that are connected to the drain terminals of the eleventh transistor P5 and the twelfth transistor P7, respectively.

The overdrive unit 20 receives the control signals ctrl<0:1> and accordingly applies a first overdrive voltage OVD_1 and a second overdrive voltage OVD_2 to the first output signal IO and the second output signal IOb, respectively. The overdrive unit 20 includes a first pulse generating unit 21 that receives the control signal ctrl<0>, a first power supply unit 22 that receives an output signal of the first pulse generating unit 21 and applies the first overdrive voltage OVD_1 to the first output signal IO, a second pulse generating unit 23 that receives the control signal ctrl<1>, and a second power supply unit 24 that receives an output signal of the second pulse generating unit 23 and applies the second overdrive voltage OVD_2 to the second output signal IOb.

The first pulse generating unit 21 determines the operation and the operation time of the first power supply 22 in accordance with the control signal ctrl<0>. The first pulse generating unit 21 includes a first delayer DL1 that receives the control signal ctrl<0>, an eighth inverter IV6 that receives an output signal of the first delayer DL1, a first NAND gate ND1 that receives an output signal of the eighth inverter IV6 and the output signal of the first delayer DL1, and a ninth inverter IV7 that receives an output signal of the first NAND gate ND1 and provides the output of the first pulse generating unit 21.

The second pulse generating unit 23 determines the operation and the operation time of the second power supply unit 24 in accordance with the control signal ctrl<1>. The second pulse generating unit 23 includes a second delayer DL2 that receives the control signal ctrl<1>, a tenth inverter IV8 that receives an output signal of the second delayer DL2, a second NAND gate ND2 that receives an output signal of the tenth inverter IV8 and the output signal the second delayer DL2, and an eleventh inverter IV9 that receives the output signal of the second NAND gate ND2 and provides the output of the second pulse generating unit 23.

The first power supply unit 22 receives a pulse from the first pulse generating unit 21 and in response applies an external power supply VDD to the output terminal of the first output unit 14. The first power supply unit 22 includes a fourteenth transistor N4 that has a drain terminal that is applied with the external power supply VDD, a gate terminal that receives the pulse of the first pulse generating unit 21, and a source terminal that is connected to the output terminal of the first output unit 14.

The second power supply unit 24 receives a pulse from the second pulse generating unit 23 and in response applies the external power supply VDD to the output terminal of the second output unit 13. The second power supply unit 24 includes a fifteenth transistor N8 that has a drain terminal that is applied with the external power supply VDD, a gate terminal that receives the pulse of the second pulse generating unit 23, and a source terminal that is connected to the output terminal of the second output unit 13.

The operation of the semiconductor memory apparatus according to an embodiment of the invention that has the above-described structure will be described below.

When the data is at a logic high level during the write operation, i.e., the write enable signal wen and the data are both at a high level, the first input unit 11 outputs a low signal, and the first latch unit 12 that receives the output signal of the first input unit 11 maintains a level of the output signal of the first input unit 11, inverts the output signal, and outputs the inverted output signal. At this time, the output signal of the first latch unit 12 is the control signal ctrl<0>. Therefore, the first output unit 14 that receives the control signal ctrl<0> outputs a high signal at the core voltage Vcore level. Meanwhile, the second output unit 13 outputs a low signal. Accordingly, the first output signal IO is the high signal and the second output signal IOb is the low signal.

The control signal ctrl<0> is input to the first pulse generating unit 21, which generates the pulse that enables the first power supply unit 22 by a delayed time of the first delayer DL1. The first power supply unit 22 applies the external power supply VDD to the first output signal IO by the delay time of the first delayer DL1.

During the delay time of the first delayer DL1 from the time when the first output signal IO transits to a high level, the first output signal IO is at the high level of the external power supply VDD. However, after the delay time of the first delayer DL1, the first output signal IO is the high level of the core voltage Vcore.

When the data signal is at a low level during the write operation, i.e., the write enable signal wen and the inverted data are both at a high level, the second input unit 15 outputs a low signal, and the second latch unit 16 that receives an output signal of the second input unit 15 maintains a level of the output signal of the second input unit 15, inverts the output signal thereof, and outputs the inverted output signal. At this time, the output signal of the second latch unit 16 is the control signal ctrl<1>. Therefore, the second output unit 13 that receives the control signal ctrl<1> output a high signal at the core voltage Vcore level. Meanwhile, the first output unit 14 outputs a low signal. Accordingly, the second output signal IOb is the high signal and the first output signal IO is the low signal.

The control signal ctrl<1> is input to the second pulse generating unit 23, which generates the pulse that enables the second power supply unit 24 by a delayed time of the second delayer DL2. The second power supply unit 24 applies the external power supply VDD to the second output signal IOb by the delay time of the second delayer DL2.

During the delay time of the second delayer DL2 from the time when the second output signal IOb transits to a high level, the second output signal IOb is at the high level of the external power supply VDD. However, after the delay time of the second delayer DL2, the second output signal IO is at the high level of the core voltage Vcore.

That is, when the first output signal IO or the second output signal IOb of the semiconductor memory apparatus according to the embodiment of the invention transmits to a high level, the first output signal IO or the second output signal IOb is set to the high signal of the external power supply VDD level during the delay time of the first delayer DL1 or the second delayer DL2 from the time when the first output signal IO or the second output signal IOb transits to the high level. Therefore, when the semiconductor memory apparatus according to the embodiment of the invention performs the write operation, the operation of writing the data into the cells is performed more stably and more quickly than that of the conventional semiconductor memory apparatus.

The above-described operation of the write driver 10 is only performed during a period when the reset signal reset is at the high level, and when the reset signal reset is at the low level, the write driver 10 finishes the operation. The first output signal IO and the second output signal IOb are initialized to the core voltage Vcore level.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The semiconductor memory device according to the embodiment of the invention performs a stable write operation at high speed by applying a voltage, which has a voltage level higher than the high signal, for a predetermined time when the write driver of the semiconductor memory device according to the related art outputs the high signal.

What is claimed is:

1. A semiconductor memory apparatus comprising:
   a write driver configured to transmit input data to an input/output (IO) line during a write operation; and
   an overdrive unit having a delayer, coupled to output terminals of the write driver, and configured to drive the IO line by an overdriving voltage, during a preset delaying time of the delayer according to a control signal.

2. The semiconductor memory apparatus of claim 1, wherein the overdriving voltage is larger than a driving voltage of the write driver.

3. The semiconductor memory apparatus of claim 1, wherein the write driver comprises an initialization unit configured to receive a reset signal and to initialize the IO line.

4. The semiconductor memory apparatus of claim 2, wherein the overdrive unit comprises:
   a pulse generating unit configured to generate and output a pulse; and
   a power supply unit having an input configured to receive the pulse output of the pulse generating unit, the power supply unit being configured to apply a voltage having a voltage level higher than the driving voltage of the write driver to the IO line during an enable period of the pulse.

5. The semiconductor memory apparatus of claim 4, wherein the pulse generating unit comprises:
   the delayer having an input and an output, the delayer being configured to delay an input signal;
   a first inverter having an input configured to receive the output signal of the delayer and configured to produce an output signal;
   a NAND gate having an output and inputs configured to receive the output signal of the delayer and the output signal of the first inverter; and
   a second inverter having an input configured to receive the output of the NAND gate and an output that serves as an output terminal of the pulse generating unit.

6. The semiconductor memory apparatus of claim 4, wherein an operation of the power supply unit is determined according to a level of the pulse.

7. The semiconductor memory apparatus of claim 6, wherein the power supply unit comprises a transistor having a gate terminal configured to receive the pulse output of the pulse generating unit, a drain terminal configured to receive a voltage having a voltage level higher than an enable voltage, and a source terminal connected to the IO line.

8. A semiconductor memory apparatus comprising:
   a write driver having inputs configured to receive a reset signal, a write enable signal, and a data signal, and an output, the write driver being configured to transmit data from the data signal to an input/output (IO) line when the write enable signal is applied; and
   an overdrive unit having an input configured to receive the output of the write driver and an output configured to connect to the IO line of the write driver and output a voltage larger than a driving voltage of the write driver when the input is at a logic high level.

9. The semiconductor memory apparatus of claim 8, wherein the write driver comprises an initialization unit having an input configured to receive the reset signal, the initialization unit being configured to initialize the IO line.

10. The semiconductor memory apparatus of claim 8, wherein the overdrive unit comprises:
    a pulse generating unit configured to generate and output a pulse; and
    a power supply unit having an input configured to receive the pulse output from the pulse generating unit, the power supply unit being configured to apply a voltage having a voltage level higher than a driving voltage of the write driver to the IO line during an enable period of the pulse.

11. The semiconductor memory apparatus of claim 10, wherein the pulse generating unit comprises:
a delayer having an input and an output, the delayer being configured to delay an input signal;
a first inverter having an input configured to receive the output signal of the delayer and configured to produce an output signal;
a NAND gate having an output and inputs configured to receive the output signal of the delayer and the output signal of the first inverter; and
a second inverter having an input configured to receive the output of the NAND gate and an output that serves as an output terminal of the pulse generating unit.

12. A semiconductor memory apparatus comprising:
a write driver having inputs configured to receive a reset signal, a write enable signal, and a data signal, and an output, the write driver being configured to transmit data from the data signal to an input/output (IO) line when the write enable signal is applied; and
an overdrive unit having an input configured to receive the output of the write driver and output connected to the IO line of the write driver, the overdrive unit being configured to operate such that a first voltage, having a higher level than a voltage level of a driving voltage of the write driver, is output when the reset signal is at a high level and the input is at a logic high level, and a second voltage, having a lower level than the voltage level of the first voltage, is output when the reset signal is at a low level.

13. The semiconductor memory apparatus of claim 12, wherein the overdrive unit comprises:
a pulse generating unit configured to generate and output a pulse; and
a power supply unit having an input configured to receive the pulse output from the pulse generating unit, the power supply unit being configured to apply a voltage having a voltage level higher than the driving voltage of the write driver to the IO line during an enable period of the pulse.

14. The semiconductor memory apparatus of claim 13, wherein the pulse generating unit comprises:
a delayer having an input and an output, the delayer being configured to delay an input signal;
a first inverter having an input configured to receive the output signal of the delayer and configured to produce an output signal;
a NAND gate having an output and inputs configured to receive the output signal of the delayer and the output signal of the first inverter; and
a second inverter having an input configured to receive the output of the NAND gate and an output that serves as an output terminal of the pulse generating unit.

* * * * *